United States Patent [19]

Bohbot et al.

[11] Patent Number: 5,326,284
[45] Date of Patent: Jul. 5, 1994

[54] CIRCUIT ASSEMBLIES OF PRINTED CIRCUIT BOARDS AND TELECOMMUNICATIONS CONNECTORS

[75] Inventors: Michel Bohbot, Cote St-Luc; Paul A. Guilbert, Lasalle, both of Canada

[73] Assignee: Northern Telecom Limited, Montreal, Canada

[21] Appl. No.: 904,637

[22] Filed: Jun. 26, 1992

[51] Int. Cl.⁵ ............................................. H01R 23/02
[52] U.S. Cl. ....................................... 439/676; 439/607
[58] Field of Search ....................... 174/257, 260, 261; 361/391, 393, 402, 409, 414; 307/150; 439/68–70, 620, 85, 676, 55, 76

[56] References Cited

U.S. PATENT DOCUMENTS

| | | | |
|---|---|---|---|
| 4,164,778 | 8/1979 | Savairi et al. | 361/409 |
| 4,850,887 | 7/1989 | Sugawara | 439/108 |
| 4,899,118 | 2/1990 | Polinski, Sr. | 333/246 |
| 5,006,822 | 4/1991 | Reddy | 361/402 |
| 5,065,502 | 11/1991 | Amante | 361/402 |
| 5,186,647 | 2/1993 | Denkmann et al. | 439/395 |

Primary Examiner—David L. Pirlot
Attorney, Agent, or Firm—Foley & Lardner

[57] ABSTRACT

In a circuit assembly of two connectors and a printed circuit board positioned between them, a parasitic reactive coupling is created by the connectors. In the circuitry of the circuit board, a compensating reactive coupling is provided. This is at least partly formed by lengths of conductor path in the board, which lengths are spaced apart with a specific gap over a certain distance along the lengths to give a desired inductive compensating coupling. If required, the compensating reactive coupling also includes capacitors provided by capacitor plates forming parts of different conductor paths on opposite sides of the board.

3 Claims, 4 Drawing Sheets

CIRCUIT ASSEMBLIES OF PRINTED CIRCUIT BOARDS AND TELECOMMUNICATIONS CONNECTORS

This invention relates to circuit assemblies of printed circuit boards and telecommunications connectors.

In the telecommunications field, incoming telecommunication cables are electrically connected with end user equipment through electrical connectors. The conventional transmission mode has, in the past, been at low frequencies, e.g. up to 100 kHz and, as technology has improved, electrical connector and cable designs have been capable of transmitting signals at such frequencies without being particularly concerned with cross-talk problems. However, as telecommunications end user equipment have been developed over more recent times, there is an increasingly greater need for the use of high frequency signals to operate this equipment. As frequency increases, cross-talk also increases and it has been found that at much higher frequencies which are now being commonly used, e.g. above 16 MHz, the degree of cross-talk has reached unacceptable proportions. In an attempt to combat this problem, improvements have been made to cable designs until most recently cables of certain designs are being produced which are capable of providing satisfactory suppression of cross-talk at these higher frequencies along the cable lengths. One such cable is that described in U.S. Pat. No 5,010,210 granted Apr. 23, 1991 in the name of S. Sidi.

As a result of these most recent developments, it is now becoming clear that in a telecommunications line system of cables of new design and connectors, that at high frequencies an undesirable and disproportionate amount of cross-talk is occurring in the connectors themselves. This problem is augmented in a circuit assembly which includes two connectors placed in series between ends of conductor wires such as when the connectors form parts of a unitary structure together with a printed circuit board electrically connecting the connectors. The present invention seeks to provide a circuit assembly of connector means and printed circuit board which lessens the above problem.

Accordingly, the present invention provides a circuit assembly of a telecommunications connector means and a circuit member comprising a planar support element rigidly carrying conductor paths in intimate contact with the support element, and wherein the connector means is mounted upon the support element with the connector means having at least two conductor pairs electrically connected to corresponding pairs of conductor paths of the circuit member, each conductor to an individual circuit path, and wherein a parasitic reactive coupling exists in the connector means between a first conductor of one pair and a first conductor of the other pair, the circuit member including a compensating reactive means between the first conductor path of the one pair of conductor paths and the second conductor path of the other pair of conductor paths.

The circuit member may be a printed circuit board or a resistor network which comprises a ceramic base with conductor paths added thereto, e.g. by thick film techniques.

In the above assembly, according to the invention, in the connector means the parasitic reactive coupling is mainly in the form of a parasitic inductive coupling between conductors, which tend to have a mutually parallel relationship, and to a smaller extent by a capacitive coupling across the distance between the conductors. The compensating reactive means may comprise a compensating inductor formed by the conductor paths of the circuit member being fixed at a determined distance apart sufficiently close to provide an inductive effect and the conductor paths extending for a sufficient length at this close spacing so as to provide a required compensating inductance capacitor. In addition, the compensating reactive means also comprises a capacitor formed by the support element and a capacitor plate provided as part of each of the first and second conductor paths, the two plates being in opposition with the support element between them.

Embodiments of the invention will now be described, by way of example, with reference to the accompanying drawings, in which.

Figure 1:
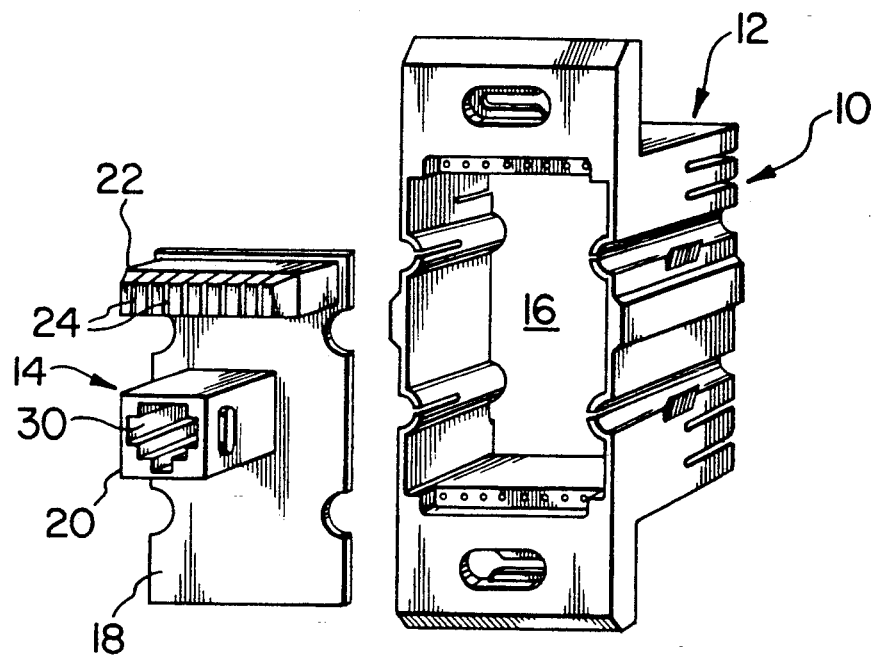
FIG. 1 is an isometric view of a prior circuit assembly of printed circuit board and connector means as part of a wall socket.

As shown in FIG. 1, in a prior art structure of a telecommunications wall outlet 10 there is provided a housing 12 and a circuit assembly 14 for mounting within a chamber 16 of the housing 12. The circuit assembly 14 comprises a circuit member which is a printed circuit board 18 and a connector means in the form of two connectors, namely a modular telephone jack 20 and a planar connector 22, the two connectors being mounted upon one surface of the board as shown. The connector 22 may be of the construction described in U.S. Pat. No. 4,909,754 in the name of R. Paradis. This connector need not be described in detail therefore except to state that it comprises a single molded planar dielectric body having along one of its sides a plurality of molded slots 24 facing outwardly from the printed circuit board 18. Terminal members (not shown) extend through the body, each terminal member having a longitudinally extending main portion which is bifurcated for substantially the whole of its length to provide two arms located substantially side-by-side in the same plane and lying one on each side of an individual slot 24 to provide an insulation displacement terminal for a wire to be placed between them. The terminal members have, at their other ends, terminals (see FIG. 2) which are staggered along two parallel lines 26a and 26b and are soldered into terminal receiving holes in the substrate 27 of the printed circuit board 18 for connection by circuitry in the board with terminals of the modular telephone jack 20. The terminals also lie along two parallel lines 28a and 28b in staggered relationship and are soldered into the substrate 27. Circuitry of the board 18 is provided by conductor paths in the board and which extend along the most convenient routes to the terminals of the modular jack. An example of the routes followed by the conductor paths 29 is shown in FIG. 2.

Figure 3:
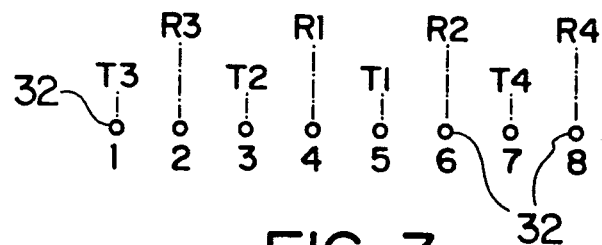
FIG. 3 is a diagrammatic end view of terminals in one of the connectors of the connector means in FIG. 1 and showing the relative positions of the terminals.

The terminal jack 20 is of conventional construction and needs no description. However, it is worthy of mention that the terminal jack 20 does include a plurality (namely 8) resilient cantilever terminals (not shown) which extend into a cavity 30 of the jack for electrical connection with terminal strips of a plug when this is inserted into the jack in known manner. The plug is to be connected to a four pair cable for connection to end user equipment. As shown by FIG. 3, the terminals in this particular jack are arranged in planar array as is indicated diagrammatically by the positions 32. These positions are numbered consecutively, (1 to 8 from the left-hand side of FIG. 3). Also included in FIG. 3 and positioned between the numbers 1 to 8 is a certain nomenclature which identifies the ring and tip terminals and also the particular pair of incoming wires with which each pair of ring and tip terminals is associated. For instance, in this nomenclature, R1' and T1 indicate the tip and ring respectively for a first conductor wire pair of the cable and R3 and T4 indicate the ring terminal for a third conductor wire pair and the tip terminal for a fourth conductor wire pair.

As will be seen from FIG. 3, positions 4 and 5 are associated with the ring and tip of the first conductor wire pair. These are flanked by positions 3 and 6 which are respectively the tip and ring for the second conductor wire pair. Positions 1 and 2 relate to tip and ring for the third conductor wire pair and positions 7 and 8 relate to tip and ring for the fourth conductor wire pair.

Figure 2:
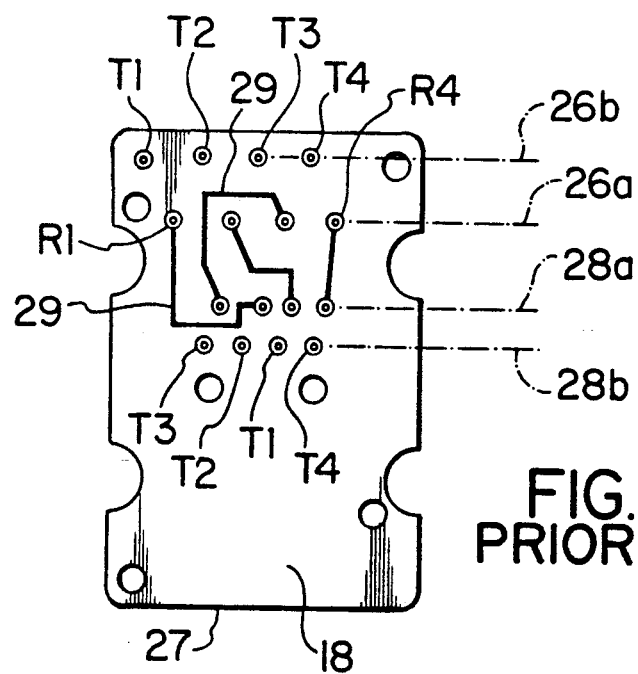
FIG. 2 is a plan view of the printed circuit board in FIG. 1 showing a typical circuitry on one side of the board.

In FIG. 2, the terminals for the modular jack 20 on the line 28a are ring terminals and those on line 28b are tip terminals electrically connected to the corresponding terminals at positions 1 to 8 in FIG. 3. Likewise the terminals for connector 22 along line 26a are ring terminals and those along line 26b are tip terminals. Some terminals on all these four lines are marked appropriately with the same R and T designations as FIG. 3.

When a prior construction such as that described above with reference to FIGS. 1 to 3 is used to transmit low frequency signals, then it has been found that no significant cross-talk problem between conductor wires in different pairs has been found in the circuit assembly 14. However, upon the use of such an assembly for transmission of high frequency signals the cross-talk between wires in different pairs has increased dramatically so as to become exceedingly troublesome. This problem has become high-lighted recently when such constructions as the assembly 14 have been used together with more advanced cable designs which are connected to the assemblies 10 and which are themselves capable of transmitting high frequency signals while minimizing cross-talk along the length of cable in an extremely satisfactory manner. It has indeed been found that a circuit assembly such as assembly 14 has produced cross-talk over its short length of the circuit which is far greater than that produced by over three hundred meters of new designs of cable attached to the circuit assembly. The problem which exists is caused basically by the design of the connector means. This is because the connector paths through the terminal jack 20 and by the terminal members in the connector 22 lie along substantially parallel paths between the terminals and also because of the relative location of the terminal members in the two connectors.

Perhaps the greatest influence upon the amount of cross-talk between two wires of different pairs is the relative locations of the terminal members in the jack 20 which allow for parasitic reactive couplings. With reference to FIG. 3, the greatest parasitic reactive coupling exists between pair 1 and pair 2. This reactive coupling occurs, in the main, between R1 and T2 and between T1 and R2 at positions 3 and 4 and 5 and 6 respectively. Lesser parasitic couplings exist between T2 and R3 and between R2 and T4 followed by parasitic couplings between R1 and R3, and T1 and T4. There are other parasitic reactive couplings of still lesser note and which perhaps produce negligible cross-talk such as the coupling between R3 and T4 and T3 and R4.

In view of the fact that great efforts and successes have been made in producing telecommunications cables which significantly reduce cross-talk along the cable lengths, then the electrical connectors and printed circuit boards which provide the circuit assemblies fail significantly in reducing cross-talk to a comparable degree.

In the following embodiment, a circuit assembly will now be described which in use with high frequency signal transmission is extremely effective in suppressing cross-talk between conductor paths associated with different pairs of conductor wires.

In the embodiment shown in FIG. 4, a circuit assembly 50 is basically similar to that shown in FIG. 1 in that it includes a printed circuit board 52 with a connector means comprising a connector 22 as described with reference to FIG. 1 and a modular telephone jack 20 also as described with reference to FIG. 1. The telephone jack 20 of the embodiment does of course have the tip and ring positions as already described with reference to FIG. 3. Parasitic reactive couplings are produced by the conductor paths associated with wires of different pairs both in the connector 22 and in the telephone jack 20, with the greatest influence on the coupling effects being provided by the positions of the terminal members in the jack 20 as shown in FIG. 3 and as described above.

Figure 4:
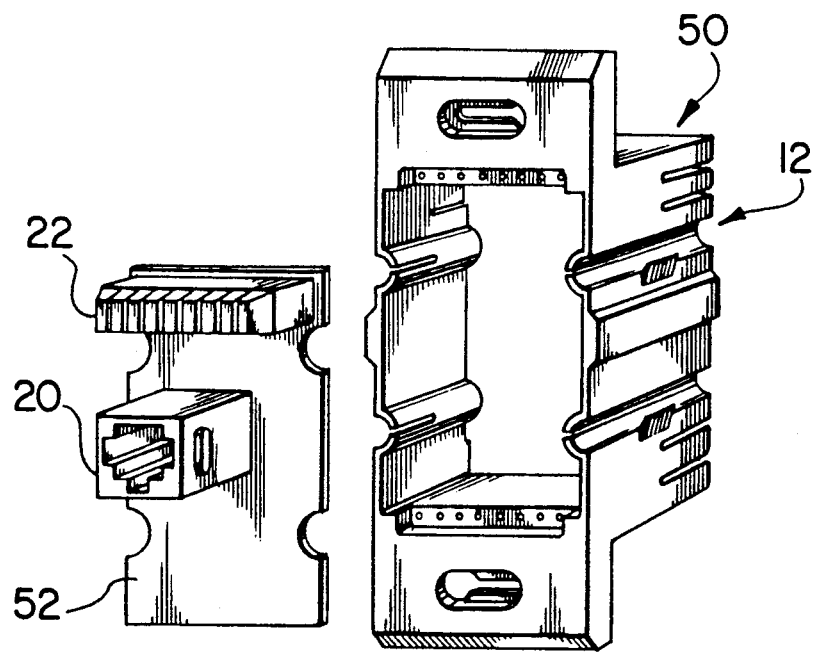
FIG. 4 is an isometric view of a circuit assembly of printed circuit board and connector means according to the embodiment.

The circuit assembly of the embodiment in FIG. 4 differs from that of the prior art illustrated in FIGS. 1 and 2 in the fact that the printed circuit board 52 is provided with compensating reactive means between conductor paths associated with different pairs of conductor wires of cable to be connected to the assembly, this compensation acting against the parasitic reactive coupling in the connector means to significantly reduce the cross-talk effect in the circuit assembly as a whole.

Figure 5A:
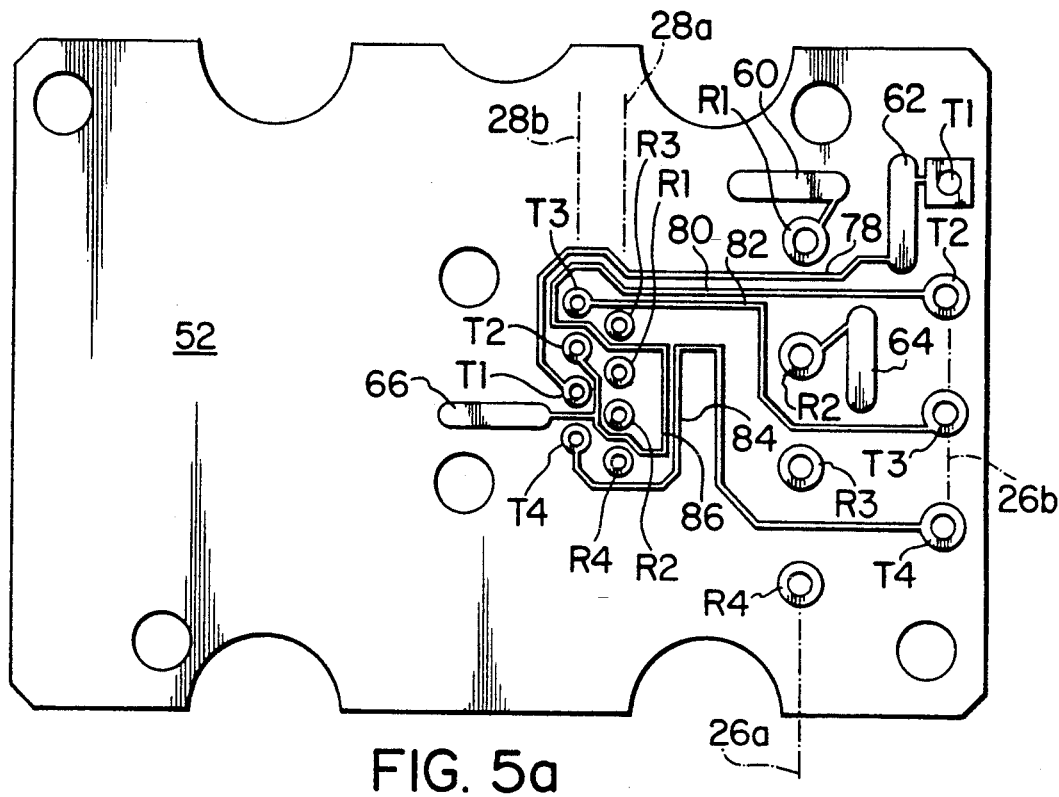
FIG. 5a is a plan view on one side of the printed circuit board of the structure of the embodiment and showing certain parts of the circuitry of the board.

The compensating reactive coupling is both capacitive and inductive in that capacitors are provided between certain paths and inductors between certain paths on the printed circuit board 52. These compensating couplings will be described with reference to FIGS. 5a and 5b. FIG. 5a is a direct plan view onto one side of the printed circuit board 52 and FIG. 5b is a mirror image of the plan view on the other side of the board, the mirror image being provided so that a direct comparison may be made between the two sides of the board without difficulty.

Figure 5B:
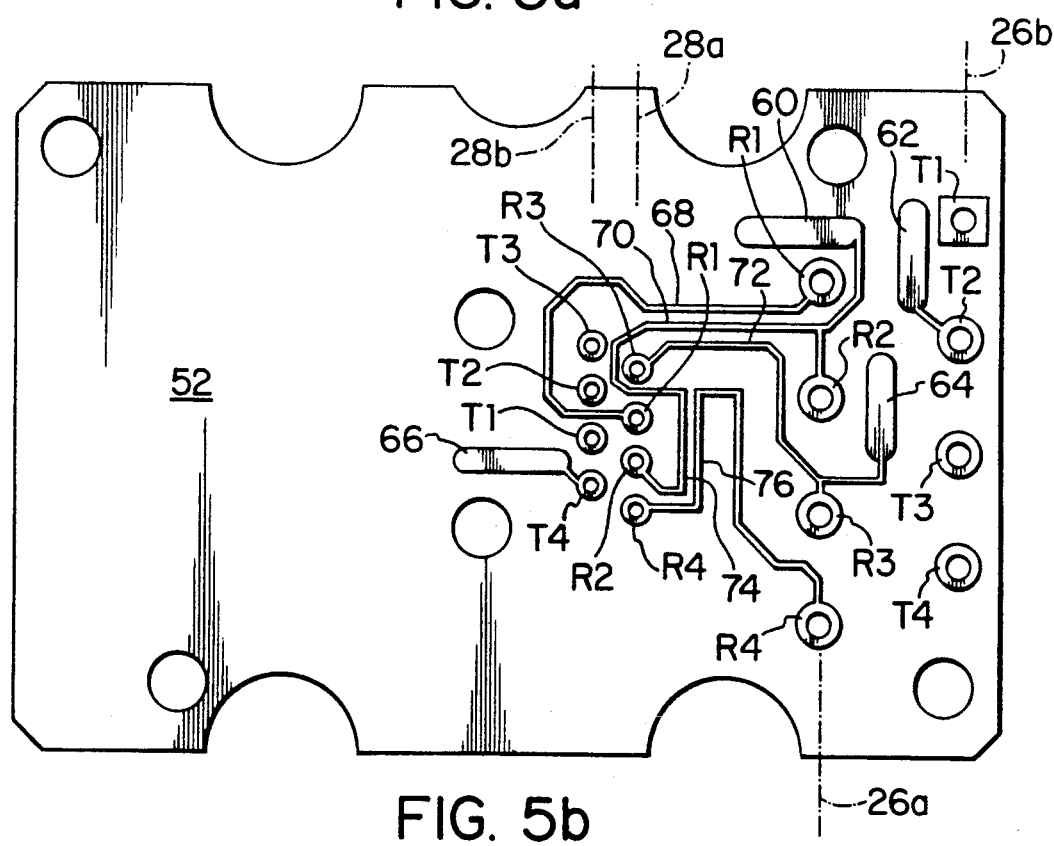
FIG. 5b is a mirror image of the other side of the printed circuit board of the embodiment, showing the remainder of the circuitry on the board.

As may be seen from FIGS. 5a and 5b, in the board circuitry, each tip and ring terminal on lines 28a and 28b is connected by a conductor path with a corresponding tip and ring terminal on the lines 26a and 26b. Capacitive means of the compensating reactive means includes four capacitors provided by plates formed as part of the printed circuit. One capacitor is formed between the substrate of the printed circuit board and capacitor plates 60 which are opposed, one on each side of the substrate as shown by comparing FIGS. 5a and 5b. These capacitor plates are connected one to terminal R1 on line 26a (FIG. 5a) and the other plate 60 is connected to R2 on line 26a (FIG. 5b). A second pair of opposed capacitor plates 62 are connected in the circuitry, one to terminal T1 (FIG. 5a) and the other to terminal T2 (FIG. 5b). Third and fourth capacitors are provided by a pair of opposed plates 64 and a pair of opposed plates 66 in combination with the substrate located between them. The plates 64 are electrically connected one to the R2 terminal in line 26a (FIG. 5a) and the other to the R3 terminal in line 26a (FIG. 5b). The capacitive plates 66 are electrically connected one to terminal T2 in line 28b (FIG. 5a) and the other to T4 terminal also in line 28b (FIG. 5).

Hence, capacitors provided and associated between terminals T1 T2, R1 R2, R2 R3 and T2 T4, act as a partial compensation against the parasitic coupling provided respectively between the conductors associated with the terminals R1 T2, T1 R2, T2 R3 and R2 T4, in the connectors 20 and 22. However, the capacitive compensation is not entirely sufficient to compensate for the whole of the parasitic problem existing between the conductors in the connectors. To provide the required compensating reactive coupling the capacitive compensation assists inductive compensation provided by inductive means on the printed circuit board. Inductive means comprises an inductor formed between parallel lengths of path 68 and 70 on the printed circuit board and extending between the two terminals R1 and the two terminals R2 in the terminal lines 26a and 28a. Inductors are also provided between the length of path 70 and length of path 72 which extends between the two R3 terminals on lines 26a and 28a, and along lengths of path 74 and 76 extending respectively between the two R2 terminals and the two R4 terminals in lines 26a and 28a. This may be seen from FIG. 5b. In addition, inductors are provided between the tip terminals along the conductor paths as shown in FIG. 5a. These inductors exist between lengths of path 78 and 80 extending, respectively, between the two terminals T1 and the two terminals T2, between the length of path 80 and a length of path 82 which extends between the two terminals T3, on lines 26b and 28b, and between lengths of path 84 and 86 extending between the two terminals T2 and the two terminals T4. The parallel lengths of path 78 to 86 and their distances apart are chosen such that the inductors provide inductive effects which, when assisted by the capacitors provided by the plates 60 to 66, substantially compensate for the parasitic capacitive and inductive coupling in the conductor paths in the connectors which produce the most serious cross-talk effects.

Figure 6:
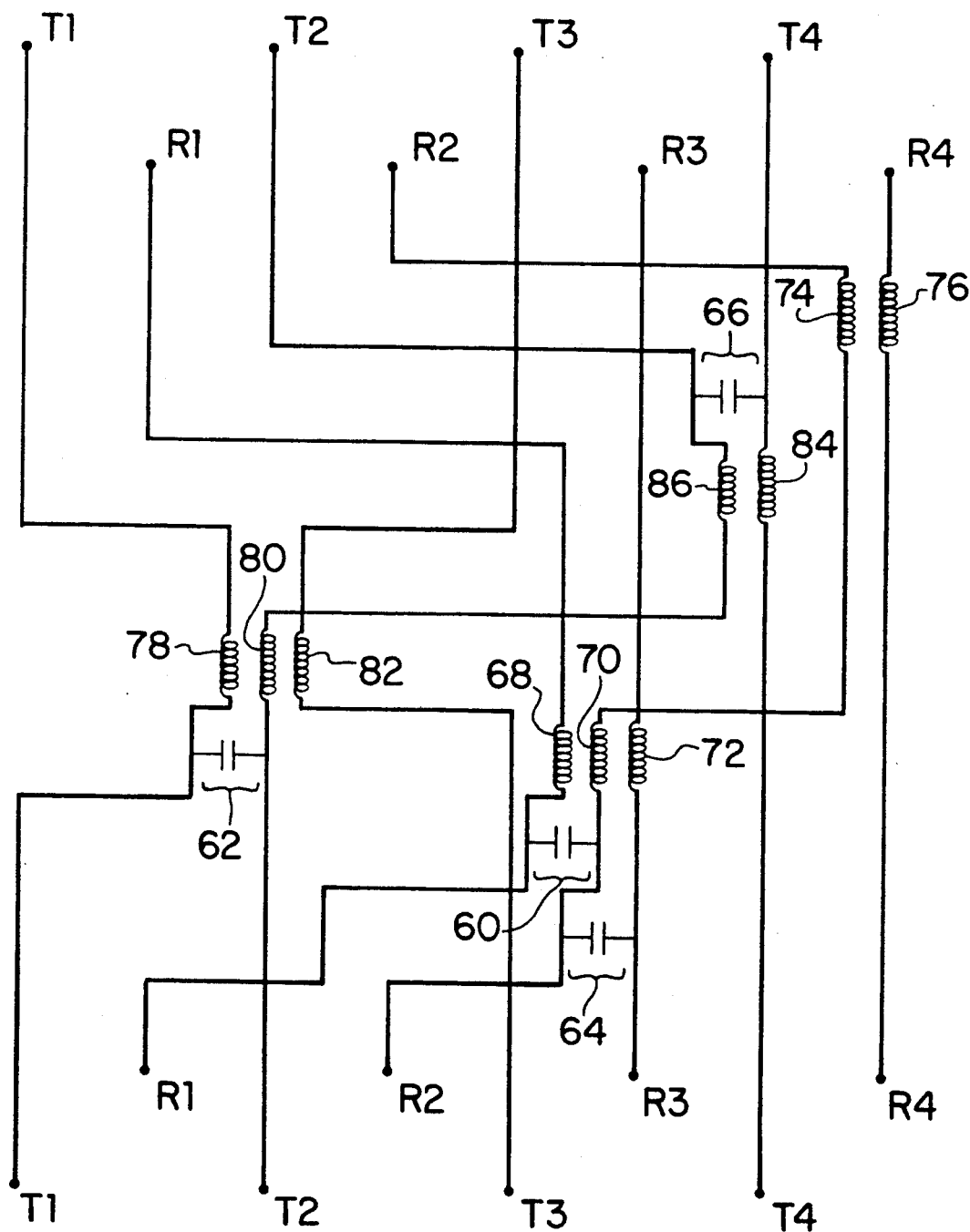
FIG. 6 is a circuitry diagram of the board.

FIG. 6 is an electrical circuit diagram showing the circuitry through the printed circuit board with the capacitors and the inductors indicated in the circuitry and identified by the reference numerals for the capacitor plates and the lengths of paths referred to above with regard to FIGS. 5a and 5b.

The following Table shows the parasitic couplings produced by the conductors passing through the connectors 20 and 22 on the left-hand side of the figure, and on the right-hand side, the compensating capacitors and inductors provided upon the circuit board 52 are shown. The parasitic couplings are shown from line-to-line in decreasing order of significance for producing cross-talk problems throughout a high frequency line. Thus line A shows the parasitic couplings which produces the greatest cross-talk effect. The parasitic couplings shown by line B have a slighter less effect and those produced by lines C, D and E have substantially minimal effect. The compensating capacitors and inductors shown on the right-hand side of the Table are provided upon the printed circuit board for the purpose of substantially compensating for all of the cross-talk problems produced by the parasitic couplings in lines A and B. As may be seen from the right-hand side of the table no particular compensating effect is produced for the parasitic problems shown in lines C, D and E. The reason for this is that these parasitic couplings produce an insignificant degree of cross-talk and this may be disregarded in the design of the circuitry for the printed circuit board

TABLE

| Parasitic Reactance | Compensating Reactance | |
|---|---|---|
| | Capacitive | Inductive |
| A) R1,T2; T1,R2 | T1,T2; R1,R2 | T1,T2; R1,R2 |
| B) T2,R3; R2,T4 | R2,R3; T2,T4 | R2,R3; R2,R4 |
| | | T2,T3; T2,T4 |
| C) R1,R3; T1,T4 | — | — |
| D) R3,T4 | — | — |
| E) T3,R4 | — | — |

As shown by the embodiment above the printed circuit board 52 has a circuitry with inductive and capacitive compensation for the parasitic coupling effects of the connectors 20 and 22. The inductive and capacitive compensations act together to substantially eliminate the parasitic problems. Thus, in the embodiment, each parasitic reactance is greater than either of its compensating inductance or compensating capacitance when taken alone. However, it is possible for the inductance provided between specific conductor paths on the printed circuit board to substantially compensate fully for any particular parasitic reactance. In this case the use of a capacitor having capacitor plates may be avoided. As a further alternative, the inductance existing between two paths on the printed circuit board could have an overcompensating effect which could itself produce cross-talk problems. In such a situation, it would be advantageous to include a capacitor on the printed circuit board which acts against the compensation and assists the parasitic reactance of the connectors so as to reduce this cross-talk tendency of the overcompensating inductive effect.

By way of example, with regard to the latter situation discussed above, in the embodiment described there is an inductive effect created along pathways 68 and 70 which extend between the two terminals R1 and the two terminals R2. Similarly on the other side of the board an inductive effect is created along the paths 78 and 80 between the two terminals T1 and the two terminals T2. These inductive effects are insufficient to compensate fully for the parasitic coupling between conductors extending between the R1 terminals and between the T2 terminals and between the T1 terminals and the R2 terminals in the connectors. Hence, the Capacitors formed by plates 60 and 62 are required, these plates acting respectively along the paths extending between the T1 terminals and between the T2 terminals (plates 62) and between the R1 terminals and between the R2 terminals (plates 60). If, however, a situation arose where the conductor paths 68 and 70 and 78 and 80 produced a compensating effect which was far greater than the parasitic reactance which required the compensation, then it would be necessary to replace the capacitors formed by the plates 60 and 62 with one capacitor acting between the conductor paths between the two terminals R1 and between the two terminals T2 and another capacitor between the conductor paths extending between the two terminals T1 and between the two terminals R2.

What is claimed is:

1. A circuit assembly of a telecommunications conductor and a circuit member being a planar support element rigidly carrying conductor paths in intimate contact with the support element, the conductor comprising:

first and second conductor pairs electrically connected to corresponding first and second pairs of conductor paths of the circuit member, each conductor connected to an individual circuit path, the two conductor pairs disposed in a rectilinear array with the conductors of the first of the pairs flanked by the conductors of the second pair and a parasitic reactance coupling existing between adjacent first conductors of the first and second pairs and between adjacent second conductors of the first and second pairs; and first and second compensating reactances provided by the circuit member, the first compensating reactance comprising one capacitor formed by the support element and a first pair of conductor plates, one plate of the first pair being provided as part of the first conductor path of the first pair of conductor paths and the other plate of the first pair of plates being provided as part of the second conductor path of the second pair of conductor paths, the plates of the first pair being in opposition with the support element between them, and the second compensating reactance comprising another capacitor formed by the support element and a second pair of conductor plates, one plate of the second pair of plates being provided as part of the second conductor path of the first pair of conductor paths and the other plate of the second pair of plates being provided as part of the first conductor path of the second pair of conductor paths with the plates of the second pair being in opposition with the support element between them.

2. A circuit assembly of a telecommunications connector and a circuit member being a planar support element rigidly carrying signal conductor paths in intimate contact with the support element, and wherein the connector is mounted on the support element with the connector having at least two signal conductor pairs electrically connected to corresponding pairs of signal conductor paths of the circuit member, each conductor connected to an individual conductor path, wherein a parasitic reactive coupling exists in the connector between a first conductor of ne pair and a first conductor of the other pair, the circuit member comprising a compensating reactance between the first conductor path of the one pair of conductor paths and the second conductor path of the other pair of conductor paths for providing compensation for said parasitic reactance coupling to prevent cross-talk between said two conductor pairs, the compensating reactance further comprising a capacitor formed by the support element and two capacitor plates, one of the two plates being provided as part of the first conductor path of the one pair and the other plate as part of the second conductor path of the other pair, the two plates being in opposition with the support element between them.

3. An assembly according to claim 2 wherein the compensating reactance also comprises an inductor formed between the first conductor path of the one pair and the second conductor path of the other pair, the distance between the first and second conductor paths and the length over which this distance is maintained providing the desired inductance.

* * * * *